US011677105B2

United States Patent
Chang et al.

(10) Patent No.: US 11,677,105 B2
(45) Date of Patent: Jun. 13, 2023

(54) TEMPERATURE-REGULATED BATTERY SYSTEM AND METHOD OF OPERATING SAME

(71) Applicant: Nanotek Instruments, Inc., Dayton, OH (US)

(72) Inventors: Hao-Hsun Chang, Centerville, OH (US); Yu-Ming Chen, Dayton, OH (US); Yu-Sheng Su, Dayton, OH (US); Bor Z. Jang, Centerville, OH (US)

(73) Assignee: Global Graphene Group, Inc., Dayton, OH (US)

( * ) Notice: Subject to any disclaimer, the term of this patent is extended or adjusted under 35 U.S.C. 154(b) by 21 days.

(21) Appl. No.: 16/515,652

(22) Filed: Jul. 18, 2019

(65) Prior Publication Data
US 2021/0021001 A1   Jan. 21, 2021

(51) Int. Cl.
| | | |
|---|---|---|
| *H01M 10/613* | (2014.01) | |
| *H05K 7/20* | (2006.01) | |
| *H01M 10/48* | (2006.01) | |

(52) U.S. Cl.
CPC ....... *H01M 10/613* (2015.04); *H01M 10/486* (2013.01); *H05K 7/20163* (2013.01)

(58) Field of Classification Search
CPC ............. H01M 10/613; H01M 10/647; H01M 10/653; H01M 10/6554; H01M 10/6555; H01M 10/486; H05K 7/20163
See application file for complete search history.

(56) References Cited

U.S. PATENT DOCUMENTS

| | | | |
|---|---|---|---|
| 7,071,258 B1 | 7/2006 | Jang et al. | |
| 2012/0183830 A1* | 7/2012 | Schaefer | H01M 10/613 429/120 |
| 2013/0108897 A1* | 5/2013 | Christian | H01M 10/613 429/50 |
| 2018/0108956 A1* | 4/2018 | Fortenbacher | H01M 10/6571 |
| 2018/0183065 A1* | 6/2018 | Sasaki | H01M 50/431 |
| 2020/0266475 A1* | 8/2020 | Jin | H01M 10/617 |

OTHER PUBLICATIONS

Jang et al., "Processing of Nano Graphene Platelets (NGPs) and NGP Nanocomposites: A Review" J. Materials Sci. (2008) vol. 43, pp. 5092-5101.

* cited by examiner

*Primary Examiner* — James Lee

(57) ABSTRACT

Provided is a rechargeable battery system comprising at least a battery cell and an external cooling means, wherein the battery cell comprises an anode, a cathode, an electrolyte disposed between the anode and the cathode, a protective housing that at least partially encloses the anode, the cathode and the electrolyte, and at least one heat-spreader element disposed partially or entirely inside the protective housing and wherein the external cooling means is in thermal contact with the heat spreader element configured to enable transporting internal heat of the battery through the heat spreader element to the external cooling means. Also provided is a method of operating a rechargeable battery system, the method comprising implementing a heat spreader element in one or each of a plurality of battery cells and bringing the heat spreader element in thermal contact with one or a plurality of external cooling means.

12 Claims, 4 Drawing Sheets

TEMPERATURE-REGULATED BATTERY SYSTEM AND METHOD OF OPERATING SAME

FIELD

The present disclosure relates generally to the field of batteries and, in particular, to batteries that can be readily cooled to maintain a safe operating temperature.

BACKGROUND

Electric vehicles (EVs) are viewed as a promising solution to $CO_2$ emission and climate change issues. Batteries have been at the heart of the rapidly emerging EV industry. Despite the dramatic drop in cost of lithium-ion batteries (LiBs) over the past decade (from higher than US$1,000/kWh to less than US$200/kWh), the EV market still accounts for only ~1% of annual light-duty vehicle sales. Several issues (including battery flammability, range anxiety, fast chargeability, and cost) have long been regarded as responsible for consumers' reluctance to adopt EVs. Out of these, overheating or thermal runaway of battery, leading to a battery catching fire or battery explosion, has been the most serious barrier against the acceptance of battery-driven EVs. There has been no effective approach to overcoming this battery safety problem.

An urgent need exists for a battery system that can be operated in a safe mode free from any thermal runaway problem.

SUMMARY

It may be noted that the word "electrode" herein refers to either an anode (negative electrode) or a cathode (positive electrode) of a battery. These definitions are also commonly accepted in the art of batteries or electrochemistry.

The disclosure provides a rechargeable battery system comprising at least a rechargeable battery cell and at least an external cooling means, wherein the battery cell comprises an anode, a cathode, an electrolyte disposed between the anode and the cathode, a protective housing that at least partially encloses the anode, the cathode and the electrolyte, and at least one heat-spreader element disposed partially or entirely inside the protective housing. The external cooling means is in thermal contact with the heat spreader element configured to enable transporting of internal heat of the battery through the heat spreader element to the external cooling means to keep the battery operating at a safe temperature. This external cooling means is outside the battery cell and is not enclosed inside the protecting housing of the battery cell.

The external cooling means may be selected from a heat sink, a heat pipe, a vapor chamber, a stream of flowing fluid, a thermoelectric device, a heat exchanger, a radiator, or a combination thereof.

In some embodiments, the rechargeable battery cell further comprises at least a temperature sensor for measuring an internal temperature of the battery. In some embodiments, the heat-spreader element acts as a temperature sensor for measuring an internal temperature of the battery. For instance, the graphene sheet exhibits a resistance that varies with the surrounding temperature and, as such, a simple resistance measurement may be used to indicate the local temperature where the graphene sheet is disposed.

In certain embodiments, the heat-spreader element comprises a high thermal conductivity material having a thermal conductivity no less than 10 W/mK. Preferably, the heat-spreader element comprises a material selected from graphene film (e.g. composed of graphene sheets aggregated together or bonded together into a film or sheet form), flexible graphite sheet, artificial graphite film (e.g. the films produced by carbonizing and graphitizing a polymer film, such as polyimide), foil or sheet of Ag, Ag, Cu, Al, brass, steel, Ti, Ni, Mg alloy, silicon nitride, boron nitride, aluminum nitride, boron arsenide, a composite thereof, or a combination thereof.

The graphene film contains a graphene selected from pristine graphene, graphene oxide, reduced graphene oxide, graphene fluoride, graphene chloride, graphene bromide, graphene iodide, hydrogenated graphene, nitrogenated graphene, chemically functionalized graphene, or a combination thereof.

In certain embodiments, the heat-spreader element has a heat-spreading area at least as large as 50% of a surface area of the anode or cathode. The heat-spreader element is preferably flat and has a large heat-spreading area having a length-to-thickness ratio greater than 10, preferably greater than 50, more preferably greater than 100, and further more preferably greater than 500. The heat-spreader element typically has a thickness from about 0.5 μm to about 1 mm.

Preferably, the heat-spreader element is in a heat-spreading relation to the anode or the cathode. The spreader element removes heat from the battery and transfers heat to the external cooling means to keep the battery at a safe operating temperature. For instance, the heat-spreader element is disposed near or in physical contact with the anode or the cathode. There can be two or more heat spreader elements, one on the anode side and the other on the cathode side In certain embodiments, the heat-spreader element has a tab protruded outside of the protective housing, wherein the tab is configured to controllably make thermal contact with the external cooling means. For instance, the heat spreader element may be connected to a heat sink that continues to take heat away from the battery.

In certain embodiments, the battery has an anode terminal and a cathode terminal for operating the battery and the heat-spreader element is in thermal contact with the anode terminal or the cathode terminal wherein the anode terminal or the cathode terminal is configured to help spread the internal battery heat to the external cooling means. In some configurations, the heat-spreader element is in thermal contact with the protective housing or a cap of the protective housing.

The rechargeable battery may be a lithium-ion battery, lithium metal secondary battery, lithium-sulfur battery, lithium-air battery, lithium-selenium battery, sodium-ion battery, sodium metal secondary battery, sodium-sulfur battery, sodium-air battery, magnesium-ion battery, magnesium metal battery, aluminum-ion battery, aluminum metal secondary battery, zinc-ion battery, zinc metal battery, zinc-air battery, nickel metal hydride battery, lead acid battery, lead acid-carbon battery, lead acid-based ultra-battery, lithium-ion capacitor, or supercapacitor.

The present disclosure also provides a method of operating a rechargeable battery. In certain embodiments, the battery comprises therein a heat spreader element having an end connected to an electrode terminal of the battery or having a tab protruded out of a protective housing of the battery and the method comprises (a) bringing the electrode terminal or the tab in thermal contact with an external cooling means, allowing internal heat from the battery to transfer through the heat spreader element into the cooling means; and (b) operating the cooling means to keep the battery at a temperature lower than a desired temperature when the battery is discharged or when the battery supplies power to an external device (e.g. a smart phone or an EV).

In certain embodiments, the method further comprises a step of operating a temperature sensor for measuring an internal temperature of the battery. The step of operating a temperature sensor may comprise operating the heat-spreader element as a temperature sensor for measuring an internal temperature of the battery.

In the invented method, the heat-spreader element preferably comprises a high thermal conductivity material having a thermal conductivity no less than 10 W/mK and wherein a time for heating the battery to temperature Tc is no greater than 5 minutes.

In some preferred embodiments, the heat-spreader element comprises a material selected from graphene film, flexible graphite sheet, artificial graphite film, Ag, Ag, Cu, Al, brass, steel, Ti, Ni, Mg alloy sheet, silicon nitride, boron nitride, aluminum nitride, boron arsenide, a composite thereof, or a combination thereof. The graphene film preferably contains a graphene selected from pristine graphene, graphene oxide, reduced graphene oxide, graphene fluoride, graphene chloride, graphene bromide, graphene iodide, hydrogenated graphene, nitrogenated graphene, chemically functionalized graphene, or a combination thereof.

In some embodiments, the step of implementing a heat spreader element inside the battery comprises placing the heat-spreader element in physical or thermal contact with the anode or the cathode for removing heat therefrom (e.g. for transporting internal heat through the heat spreader to the external cooling means).

In some embodiments, the heat-spreader element has a tab protruded outside of the protective housing and step (a) comprises controllably making the tab in thermal contact with the external cooling means.

In certain embodiments, the battery has an anode terminal and a cathode terminal for operating the battery and the heat-spreader element is in thermal contact with the anode terminal or the cathode terminal and wherein step (a) comprises bringing the anode terminal or the cathode terminal in physical or thermal contact with the external cooling means.

In some embodiments, the heat-spreader element is in thermal contact with the protective housing or a cap of the protective housing and step (a) comprises bringing the external cooling means to thermally or physically contact the protective housing or the cap, removing heat therefrom.

DETAILED DESCRIPTION OF PREFERRED EMBODIMENTS

The present discussion of preferred embodiments makes use of lithium-ion battery as an example. The present disclosure is applicable to a wide array of rechargeable batteries, not limited to the lithium-ion batteries. Examples of the rechargeable batteries include the lithium-ion battery, lithium metal secondary battery, lithium-sulfur battery, lithium-air battery, lithium-selenium battery, sodium-ion battery, sodium metal secondary battery, sodium-sulfur battery, sodium-air battery, magnesium-ion battery, magnesium metal battery, aluminum-ion battery, aluminum metal secondary battery, zinc-ion battery, zinc metal battery, zinc-air battery, nickel metal hydride battery, lead acid battery, lead acid-carbon battery, lead acid-based ultra-battery, lithium-ion capacitor, or supercapacitor.

The disclosure provides an innovative way of keeping the operating temperature of a battery at a low and safe level. This approach is effective in preventing thermal runaway of a battery.

The disclosure provides a rechargeable battery system comprising at least a rechargeable battery cell and at least an external cooling means, wherein the at least a battery cell comprises an anode, a cathode, an electrolyte disposed between the anode and the cathode, a protective housing that partially or totally encloses the anode, the cathode and the electrolyte, and at least one heat-spreader element disposed partially or entirely inside the protective housing. The external cooling means is in thermal contact with the heat spreader element configured to enable transporting of internal heat of the battery through the heat spreader element to the external cooling means.

Figure 1A:
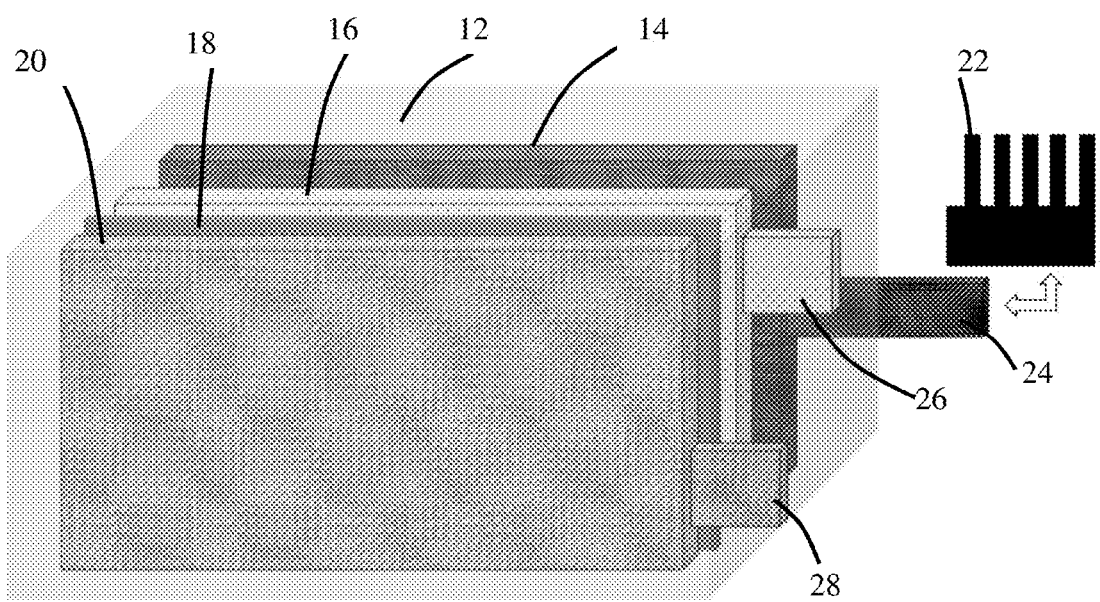
FIG. 1(A) Schematic of a battery system according to an embodiment of the present disclosure.

As illustrated in FIG. 1(A), according to some embodiments of the disclosure, the battery system comprises at least a battery cell in thermal or physical contact with an external cooling means (e.g. a heat sink, 22). The battery cell comprises an anode (negative electrode) 16, a cathode (positive electrode) 20, a separator 18 and electrolyte (not shown) disposed between the anode and the cathode, a casing or protective housing 12 that substantially encloses the above-listed components. Also enclosed is a heat spreader element 14, wherein the heat spreader element has a tab 24 protruded out of the battery cell housing 12. Also protruded out of the housing are a negative electrode terminal 26 connected to or integral with the anode 16 and a positive electrode terminal 28 connected to or integral with the cathode 20. The two electrode terminals are to be reversibly contacted with a battery charger (during battery charging) or a load (e.g. an electronic device, such as a smart phone, to be powered by the battery while discharging). It is the heat spreader element tab 24 that is in thermal or physical contact with the external cooling means (e.g. 22).

Figure 1B:
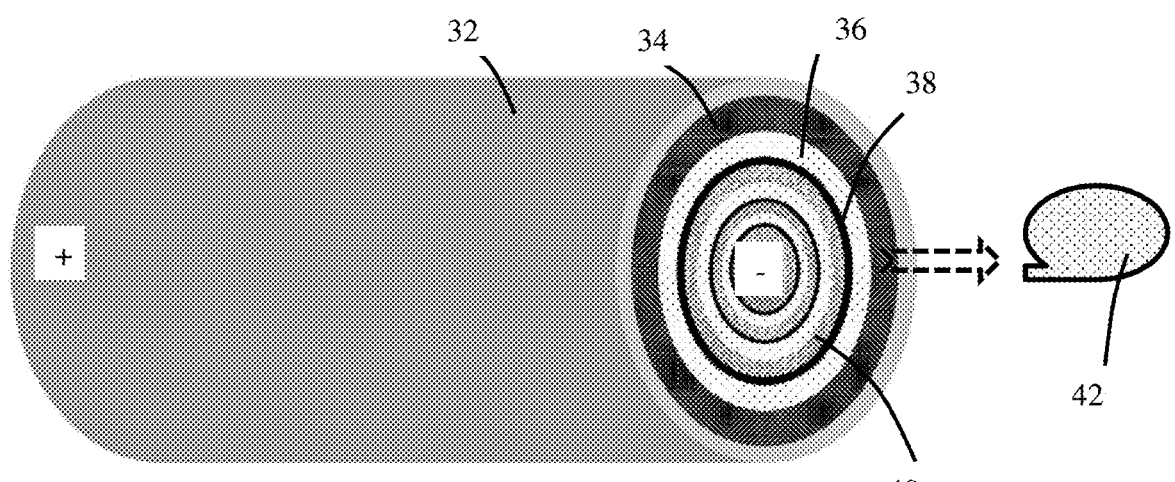
FIG. 1(B) Schematic of a battery system according to another embodiment of the present disclosure.

As illustrated in FIG. 1(B), according to another embodiment of the disclosure, the battery system comprises a battery in thermal or physical contact with an external cooling means 42. The battery comprises an anode 36, a cathode 40, a thin separator 38 and electrolyte (not shown) disposed between the anode and the cathode, a casing or protective housing 32 that substantially encloses the above-listed components. Also enclosed is a heat spreader element 34, which has one end in thermal contact with a housing cap (not shown); this cap, in combination with the housing 32, substantially seals the entire battery cell. This cap is, in turn, in thermal contact with the external cooling means 42. This cap may also serve as a terminal (e.g. negative terminal) for the battery cell; the positive terminal being located at the opposite end of this cylindrical cell. Alternatively, this cap may serve as a positive terminal and the opposite end is a negative terminal.

Figure 1C:
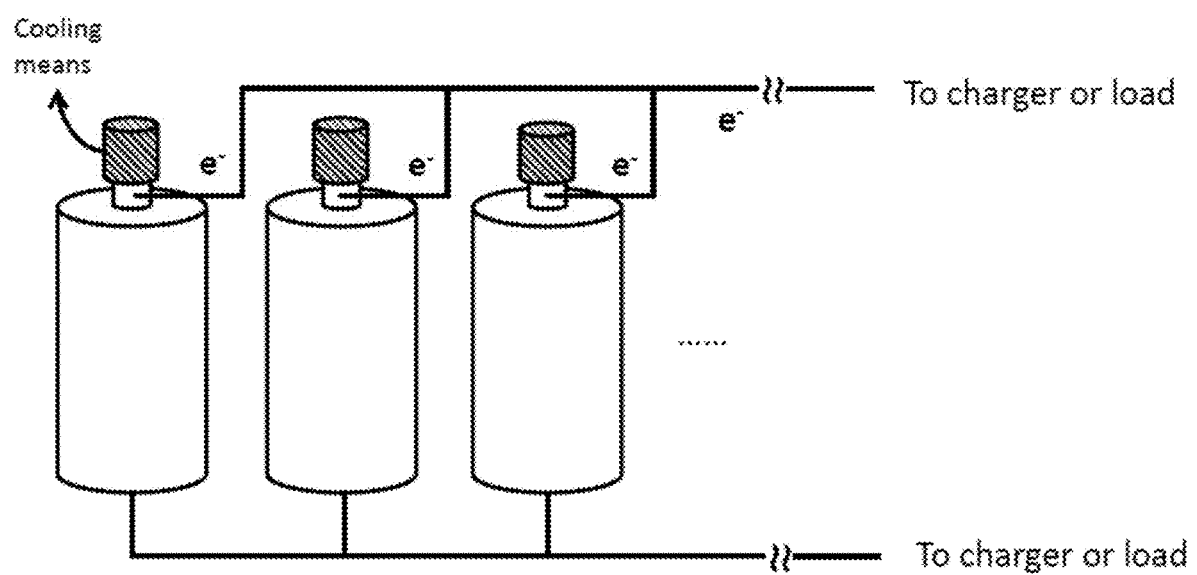
FIG. 1(C) Schematic of a battery system comprising multiple battery cells in a module in thermal contact to multiple external cooling means, according some embodiments of instant disclosure.

As illustrated in FIG. 1(C), a battery system can contain multiple battery cells (e.g. in a module or a pack), wherein each cell has at least a heat spreader element (disposed partially or entirely inside the battery cell) that is in thermal contact with at least an external cooling means. One cooling means may be in thermal contact with one or a plurality of heat spreader elements (e.g. those heat spreader elements in multiple cells). Although FIG. 1(C), as an example, shows three cooling means that are connected to three battery cells, these three cooling means can be just from the same cooling means. For instance, the same heat exchanger or radiator can be used to cool three or more battery cells by extracting heat from individual cells through their respective heat spreader elements into the same heat exchanger or radiator.

Figure 3:
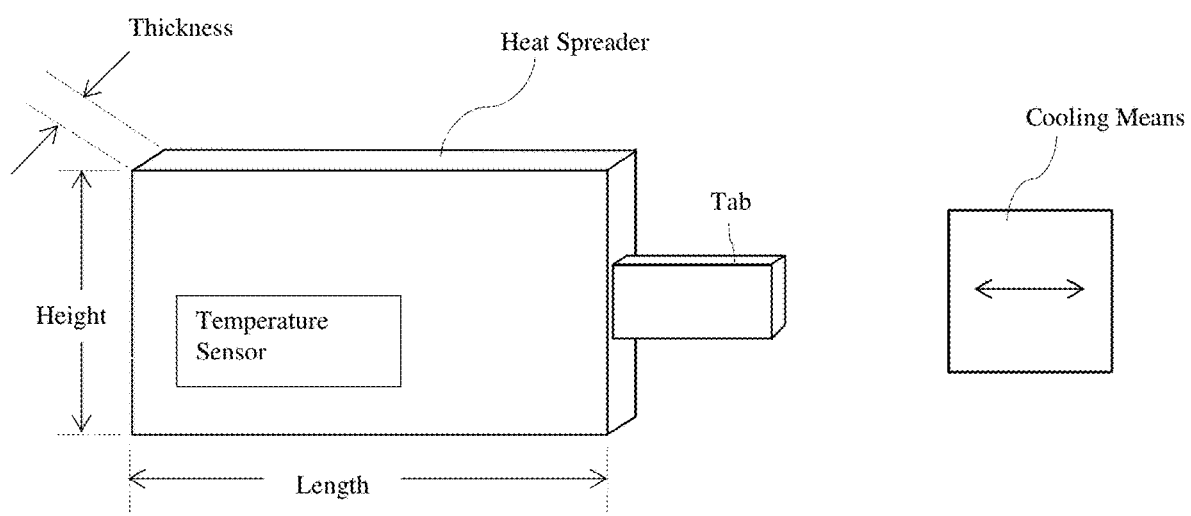
FIG. 3 Schematic of a heat spreader according to an embodiment of the present disclosure.

FIG. 3 shows a heat spreader in which the height, length, and thickness dimensions are defined. It should be understood that this drawing is not to scale, and is drawn in a manner to ease understanding, as the thickness may be much smaller (in a relative sense) than is shown. Also shown is an external cooling means that can be controllably moved into and out of thermal contact with the external tab of the heat source (as indicated by the double-headed arrow of FIG. 3). The external cooling means may be a heat sink, a heat pipe, a vapor chamber, a stream of flowing fluid, a thermoelectric device, a heat exchanger, a radiator, or a combination thereof. Lastly, a temperature sensor is shown which can be on the surface of the heat spreader, internal to the battery but spaced-apart from the heat spreader, or any other suitable location. It may be a resistive sensor, where the resistance is indicative of the temperature of the heat spreader or of the battery.

There is no limitation on the type and nature of the external cooling means provided that this cooling means per se is capable of rapidly dissipating the heat drawn from the battery interior, helping to keep the battery cool. The external cooling means may be selected from a heat sink, a heat pipe, a vapor chamber, a stream of flowing fluid, a thermoelectric device, a heat exchanger, a radiator, or a combination thereof. The temperature-regulated battery system as disclosed herein may be installed in an EV. In some embodiments, the movement of the EV itself can generate a stream of cooling air that is directed to come in direct contact with the heat spreader element or indirectly with the heat spreader element through a battery tab.

It is important that the heat spreader element has a high thermal conductivity to allow for rapid transfer of a large amount of heat from the internal portion of a battery to an external cooling means through the heat spreader element. In certain embodiments, the heat-spreader element comprises a high thermal conductivity material having a thermal conductivity no less than 10 W/mK (preferably no less than 20 W/mK, further preferably greater than 200 W/mK, more preferably greater than 400 W/mK, and most preferably greater than 800 W/mK). Preferably, the heat-spreader element comprises a material selected from graphene film (e.g. composed of graphene sheets aggregated together or bonded together into a film or sheet form), flexible graphite sheet, artificial graphite film (e.g. the films produced by carbonizing and graphitizing a polymer film, such as polyimide), foil or sheet of Ag, Ag, Cu, Al, brass, steel, Ti, Ni, Mg alloy, silicon nitride, boron nitride, aluminum nitride, boron arsenide, a composite thereof, or a combination thereof.

The graphene film contains a graphene selected from pristine graphene, graphene oxide, reduced graphene oxide, graphene fluoride, graphene chloride, graphene bromide, graphene iodide, hydrogenated graphene, nitrogenated graphene, chemically functionalized graphene, or a combination thereof. The graphene film typically exhibits a thermal conductivity from 800 to 1,800 W/mK. Flexible graphite sheet typically exhibits a thermal conductivity from 150 to 600 W/mK. Artificial graphite films (e.g. those produced by carbonizing and graphitizing a polymer film) can exhibit a thermal conductivity from 600 to 1,700 W/mK. Graphene films, flexible graphite sheets, and artificial graphite films are commonly regarded as three distinct classes of materials.

In some embodiments, the rechargeable battery further comprises at least a temperature sensor for measuring an internal temperature of the battery. In some embodiments, the heat-spreader element acts as a temperature sensor for measuring an internal temperature of the battery. For instance, the graphene sheet exhibits a resistance that varies with the surrounding temperature and, as such, a simple resistance measurement may be used to indicate the local temperature where the graphene sheet is disposed.

Carbon materials can assume an essentially amorphous structure (glassy carbon), a highly organized crystal (graphite), or a whole range of intermediate structures that are characterized in that various proportions and sizes of graphite crystallites and defects are dispersed in an amorphous matrix. Typically, a graphite crystallite is composed of a number of graphene sheets or basal planes that are bonded together through van der Waals forces in the c-axis direction, the direction perpendicular to the basal plane. These graphite crystallites are typically micron- or nanometer-sized. The graphite crystallites are dispersed in or connected by crystal defects or an amorphous phase in a graphite particle, which can be a graphite flake, carbon/graphite fiber segment, carbon/graphite whisker, or carbon/graphite nano-fiber. In other words, graphene planes (hexagonal lattice structure of carbon atoms) constitute a significant portion of a graphite particle.

A single-layer graphene sheet is composed of carbon atoms occupying a two-dimensional hexagonal lattice. Multi-layer graphene is a platelet composed of more than one graphene plane. Individual single-layer graphene sheets and multi-layer graphene platelets are herein collectively called nano graphene platelets (NGPs) or graphene materials. NGPs include pristine graphene (essentially 99% of carbon atoms), slightly oxidized graphene (<5% by weight of oxygen), graphene oxide (≥5% by weight of oxygen), slightly fluorinated graphene (<5% by weight of fluorine), graphene fluoride ((≥5% by weight of fluorine), other halogenated graphene, and chemically functionalized graphene.

Our research group was among the first to discover graphene [B. Z. Jang and W. C. Huang, "Nano-scaled Graphene Plates," U.S. patent application Ser. No. 10/274, 473, submitted on Oct. 21, 2002; now U.S. Pat. No. 7,071, 258 (Jul. 4,2006)]. The processes for producing NGPs and NGP nanocomposites were recently reviewed by us [Bor Z. Jang and A Zhamu, "Processing of Nano Graphene Platelets (NGPs) and NGP Nanocomposites: A Review," J. Materials Sci. 43 (2008) 5092-5101]. The production of various types of graphene sheets is well-known in the art.

Figure 2:
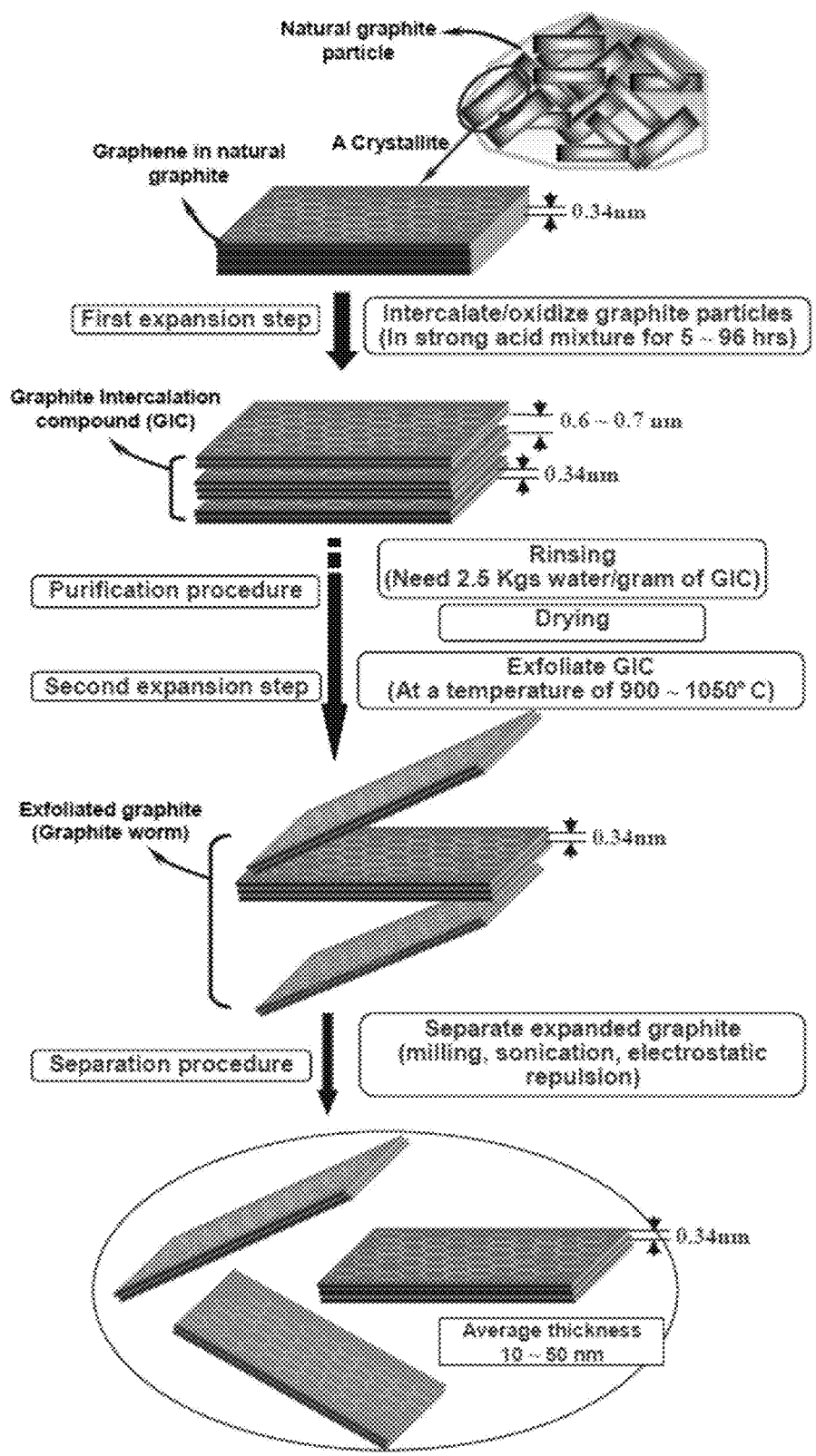
FIG. 2 A diagram showing a procedure for producing graphene oxide sheets. These sheets can then be aggregated (e.g. roll-pressed) together or slurry-coated together, followed by a heat treatment procedure to produce graphene films.

For instance, as shown in FIG. 2, the chemical processes for producing graphene sheets or platelets typically involve immersing powder of graphite or other graphitic material in a mixture of concentrated sulfuric acid, nitric acid, and an oxidizer, such as potassium permanganate or sodium perchlorate, forming a reacting mass that requires typically 5-120 hours to complete the chemical intercalation/oxidation reaction. Once the reaction is completed, the slurry is subjected to repeated steps of rinsing and washing with water. The purified product is commonly referred to as graphite intercalation compound (GIC) or graphite oxide (GO). The suspension containing GIC or GO in water may be subjected to ultrasonication to produce isolated/separated graphene oxide sheets dispersed in water. The resulting products are typically highly oxidized graphene (i.e. graphene oxide with a high oxygen content), which must be chemically or thermal reduced to obtain reduced graphene oxide (RGO).

Alternatively, the GIC suspension may be subjected to drying treatments to remove water. The dried powder is then subjected to a thermal shock treatment. This can be accomplished by placing GIC in a furnace pre-set at a temperature of typically 800-1100° C. (more typically 950-1050° C.) to produce exfoliated graphite (or graphite worms), which may be subjected to a high shear or ultrasonication treatment to produce isolated graphene sheets.

Alternatively, graphite worms may be re-compressed into a film form to obtain a flexible graphite sheet. Flexible graphite sheets are commercially available from many sources worldwide.

The starting graphitic material may be selected from natural graphite, synthetic graphite, highly oriented pyrolytic graphite, graphite fiber, graphitic nano-fiber, graphite fluoride, chemically modified graphite, meso-carbon microbead, partially crystalline graphite, or a combination thereof.

Pristine graphene sheets may be produced by the well-known liquid phase exfoliation or metal-catalyzed chemical vapor deposition (CVD).

The heat-spreader element preferably has a heat-spreading area at least as large as 50% of a surface area of the anode or cathode. The heat-spreader element is preferably flat and has a large heat-spreading area having a length-to-thickness ratio greater than 10, preferably greater than 50, more preferably greater than 100, and further more preferably greater than 500. The heat-spreader element typically has a thickness from about 0.5 µm to about 1 mm.

Preferably, the heat-spreader element is in a heat-spreading relation to the anode or the cathode and provides heat thereto before or during charging of the battery. For instance, the heat-spreader element is disposed near or in physical contact with the anode or the cathode inside the battery. There can be two heat spreader elements, one on the anode side and the other on the cathode side of a cell.

Preferably, as schematically illustrated in FIG. 1(A), the heat-spreader element has a tab protruded outside of the protective housing, wherein the tab is configured to controllably make thermal contact with the external cooling means (before or during battery charging) and get disconnected with the external cooling means when a battery temperature reaches the desired temperature Tc, for instance. The battery has an anode terminal and a cathode terminal that are connected to an anode circuit and cathode circuit, respectively, for operating the battery (e.g. for battery charging and discharging). During discharging of the battery (e.g. providing power to a smart phone or an EV), these two terminals are connected to the proper terminals of the battery management system (BMS) of the smart phone or EV. During the charging of the battery, these two terminals may be directly connected to an external battery charger or indirectly through a BMS to an external battery charger. The battery charger and BMS are well-known in the art.

In certain embodiments, the battery has an anode terminal and a cathode terminal for operating the battery and the heat-spreader element is in thermal contact with the anode terminal or the cathode terminal wherein the heat spreader element draws heat from either the anode terminal or the cathode terminal and transports the heat to the external cooling means. In some configurations, as illustrated in FIG. 1(B), the heat-spreader element is in thermal contact with the protective housing or a cap of the protective housing. This cap or housing may be made to contact with an external cooling means that receive heat from the cap or housing. Shown in FIG. 1(B) is but one of many possible configurations, wherein a sheet of heat spreader (e.g. graphene film) is disposed inside a casing (protective housing) to wrap around the anode. One end of the heat spreader element is in contact with the battery cap, which serves as a conduit to transfer heat to an external cooling means (when/if the cap is in contact with the cooling means).

The rechargeable battery may be a lithium-ion battery, lithium metal secondary battery, lithium-sulfur battery, lithium-air battery, lithium-selenium battery, sodium-ion battery, sodium metal secondary battery, sodium-sulfur battery, sodium-air battery, magnesium-ion battery, magnesium metal battery, aluminum-ion battery, aluminum metal secondary battery, zinc-ion battery, zinc metal battery, zinc-air battery, nickel metal hydride battery, lead acid battery, lead acid-carbon battery, lead acid-based ultra-battery, lithium-ion capacitor, or supercapacitor.

There is no limitation on the type of anode materials, electrolytes, cathode materials, etc. that can be used in the presently invented battery.

The anode of a lithium-ion battery (as an example) may contain an anode active material selected from the group consisting of: (A) lithiated and un-lithiated silicon (Si), germanium (Ge), tin (Sn), lead (Pb), antimony (Sb), bismuth (Bi), zinc (Zn), aluminum (Al), titanium (Ti), nickel (Ni), cobalt (Co), phosphorus (P), and cadmium (Cd); (B) lithiated and un-lithiated alloys or intermetallic compounds of Si, Ge, Sn, Pb, Sb, Bi, Zn, Al, Ti, Ni, Co, or Cd with other elements; (C) lithiated and un-lithiated oxides, carbides, nitrides, sulfides, phosphides, selenides, and tellurides of Si, Ge, Sn, Pb, Sb, Bi, Zn, Al, Ti, Fe, Ni, Co, or Cd, and their mixtures, composites, or lithium-containing composites; (D) lithiated and un-lithiated salts and hydroxides of Sn; (E) lithium titanate, lithium manganate, lithium aluminate, lithium-containing titanium oxide, lithium titanium-niobium oxide, lithium transition metal oxide; (F) carbon or graphite particles; and combinations thereof.

The cathode may contain a cathode active material selected from an inorganic material, an organic material, an intrinsically conducting polymer (known to be capable of string lithium ions), a metal oxide/phosphate/sulfide, or a combination thereof. The metal oxide/phosphate/sulfide may be selected from a lithium cobalt oxide, lithium nickel oxide, lithium manganese oxide, lithium vanadium oxide, lithium-mixed metal oxide, lithium iron phosphate, lithium manganese phosphate, lithium vanadium phosphate, lithium mixed metal phosphate, sodium cobalt oxide sodium nickel oxide, sodium manganese oxide, sodium vanadium oxide, sodium-mixed metal oxide, sodium iron phosphate, sodium manganese phosphate, sodium vanadium phosphate, sodium mixed metal phosphate, transition metal sulfide, lithium polysulfide, sodium polysulfide, magnesium polysulfide, or a combination thereof.

In some embodiments, the electrode active material may be a cathode active material selected from sulfur, sulfur compound, sulfur-carbon composite, sulfur-polymer composite, lithium polysulfide, transition metal dichalcogenide, a transition metal trichalcogenide, or a combination thereof. The inorganic material may be selected from $TiS_2$, $TaS_2$, $MoS_2$, $NbSe_3$, $MnO_2$, $CoO_2$, an iron oxide, a vanadium oxide, or a combination thereof. This group of materials is particularly suitable for use as a cathode active material of a lithium metal battery.

The metal oxide/phosphate/sulfide contains a vanadium oxide selected from the group consisting of $VO_2$, $Li_xVO_2$, $V_2O_5$, $Li_xV_2O_5$, $V_3O_8$, $Li_xV_3O_8$, $Li_xV_3O_7$, $V_4O_9$, $Li_xV_4O_9$, $V_6O_{13}$, $Li_xV_6O_{13}$, their doped versions, their derivatives, and combinations thereof, wherein $0.1<x<5$. In some embodiments, the metal oxide/phosphate/sulfide is selected from a layered compound $LiMO_2$, spinel compound $LiM_2O_4$, olivine compound $LiMPO_4$, silicate compound $Li_2MSiO_4$, Tavorite compound $LiMPO_4F$, borate compound $LiMBO_3$, or a combination thereof, wherein M is a transition metal or a mixture of multiple transition metals.

The inorganic material may be selected from: (a) bismuth selenide or bismuth telluride, (b) transition metal dichalcogenide or trichalcogenide, (c) sulfide, selenide, or telluride of niobium, zirconium, molybdenum, hafnium, tantalum, tungsten, titanium, cobalt, manganese, iron, nickel, or a transition metal; (d) boron nitride, or (e) a combination thereof.

The organic material or polymeric material may be selected from Poly(anthraquinonyl sulfide) (PAQS), a lithium oxocarbon, 3,4,9,10-perylenetetracarboxylic dianhydride (PTCDA), poly(anthraquinonyl sulfide), pyrene-4,5,9,10-tetraone (PYT), polymer-bound PYT, Quino(triazene), redox-active organic material, Tetracyanoquinodimethane (TCNQ), tetracyanoethylene (TCNE), 2,3,6,7,10,11-hexamethoxytriphenylene (HMTP), poly(5-amino-1,4-dyhydroxy anthraquinone) (PADAQ), phosphazene disulfide polymer ([(NPS$_2$)$_3$]n), lithiated 1,4,5,8-naphthalenetetraol formaldehyde polymer, Hexaazatrinaphtylene (HATN), Hexaazatriphenylene hexacarbonitrile (HAT(CN)$_6$), 5-Benzylidene hydantoin, Isatine lithium salt, Pyromellitic diimide lithium salt, tetrahydroxy-p-benzoquinone derivatives (THQLi$_4$), N,N'-diphenyl-2,3,5,6-tetraketopiperazine (PHP), N,N'-diallyl-2,3,5,6-tetraketopiperazine (AP), N,N'-dipropyl-2,3,5,6-tetraketopiperazine (PRP), a thioether polymer, a quinone compound, 1,4-benzoquinone, 5,7,12,14-pentacenetetrone (PT), 5-amino-2,3-dihydro-1,4-dyhydroxy anthraquinone (ADDAQ), 5-amino-1,4-dyhydroxy anthraquinone (ADAQ), calixquinone, $Li_4C_6O_6$, $Li_2C_6O_6$, $Li_6C_6O_6$, or a combination thereof. These compounds are preferably mixed with a conducting material to improve their electrical conductivity, rigidity and strength so as to enable the peeling-off of graphene sheets from the graphitic material particles.

The thioether polymer in the above list may be selected from Poly[methanetetryl-tetra(thiomethylene)] (PMTTM), Poly(2,4-dithiopentanylene) (PDTP), a polymer containing Poly(ethene-1,1,2,2-tetrathiol) (PETT) as a main-chain thioether polymers, a side-chain thioether polymer having a main-chain consisting of conjugating aromatic moieties, and having a thioether side chain as a pendant, Poly(2-phenyl-1,3-dithiolane) (PPDT), Poly(1,4-di(1,3-dithiolan-2-yl)benzene) (PDDTB), poly(tetrahydrobenzodithiophene) (PTHBDT), poly[1,2,4,5-tetrakis(propylthio)benzene] (PTKPTB, or poly[3,4(ethylenedithio)thiophene] (PEDTT).

In some embodiments, the organic material contains a phthalocyanine compound selected from copper phthalocyanine, zinc phthalocyanine, tin phthalocyanine, iron phthalocyanine, lead phthalocyanine, nickel phthalocyanine, vanadyl phthalocyanine, fluorochromium phthalocyanine, magnesium phthalocyanine, manganous phthalocyanine, dilithium phthalocyanine, aluminum phthalocyanine chloride, cadmium phthalocyanine, chlorogallium phthalocyanine, cobalt phthalocyanine, silver phthalocyanine, a metal-free phthalocyanine, a chemical derivative thereof, or a combination thereof. These compounds are preferably mixed with a conducting material to improve their electrical conductivity and rigidity so as to enable the peeling-off of graphene sheets from the graphitic material particles.

There is no limitation on the type of electrolyte that can be incorporated in the fast-chargeable battery: liquid electrolyte (e.g. organic solvent or ionic solid based electrolyte), polymer gel electrolyte, quasi-solid electrolyte, solid polymer electrolyte, inorganic solid electrolyte, composite electrolyte, etc.

The present disclosure also provides a method of operating a rechargeable battery system. In some embodiments, the method comprises implementing a heat spreader element in one or each of a plurality of battery cells and bringing the heat spreader element(s) in thermal contact with one or a plurality of external cooling means, allowing the heat spreader element to receive internal heat of the battery cell and transport the heat to the external cooling means.

In certain embodiments, the heat spreader element has an end connected to an electrode terminal of the battery cell or a tab protruded out of a protective housing of the battery cell and wherein the method comprises (a) bringing the electrode terminal or the tab in thermal contact with the external cooling means; and (b) operating the cooling means to keep the battery at a temperature lower than a desired temperature when the battery is discharged or when the battery supplies power to an external device.

In certain embodiments, the method further comprises a step of operating a temperature sensor for measuring an internal temperature of the battery. The step of operating a temperature sensor may comprise operating the heat-spreader element as a temperature sensor for measuring an internal temperature of the battery.

In the invented method, the heat-spreader element preferably comprises a high thermal conductivity material having a thermal conductivity no less than 10 W/mK (preferably no less than 20 W/mK, further preferably greater than 200 W/mK, more preferably greater than 400 W/mK, and most preferably greater than 800 W/mK).

In some preferred embodiments, the heat-spreader element comprises a material selected from graphene film, flexible graphite sheet, artificial graphite film, Ag, Ag, Cu, Al, brass, steel, Ti, Ni, Mg alloy sheet, silicon nitride, boron nitride, aluminum nitride, boron arsenide, a composite thereof, or a combination thereof. The graphene film preferably contains a graphene selected from pristine graphene, graphene oxide, reduced graphene oxide, graphene fluoride, graphene chloride, graphene bromide, graphene iodide, hydrogenated graphene, nitrogenated graphene, chemically functionalized graphene, or a combination thereof.

In some embodiments, the step of implementing a heat spreader element inside the battery comprises placing the heat-spreader element in physical or thermal contact with the anode or the cathode for drawing heat therefrom (e.g. for transporting heat from the anode or cathode electrode through the heat spreader to an eternal cooling means.

In some embodiments, the heat-spreader element has a tab protruded outside of the protective housing (e.g. as illustrated in FIG. 1(A)) and this tab may be configured to be in thermal contact, physical contact, or otherwise bonded or connected to the external cooling means.

In certain desired embodiments, the battery cell has an anode terminal and a cathode terminal for operating the battery and the heat-spreader element is in thermal contact with the cathode terminal (e.g. the cathode terminal protruded out as a battery cap of FIG. 1(B) and a graphene film inside the cell is configured to be in thermal contact with this cap), wherein the electrode terminal (e.g. the cathode terminal) is in physical or thermal contact with the outside cooling means. In some embodiments, the heat-spreader element is in thermal contact with the protective housing or a cap of the protective housing and the external cooling means is thermally or physically connected to the protective housing or the cap, drawing heat therefrom.

The following examples serve to provide the best modes of practice for the present disclosure and should not be construed as limiting the scope of the disclosure:

Example 1: Preparation of Single-Layer Graphene Sheets and their Heat-Spreader Films from Meso-Carbon Micro-Beads (MCMBs)

Meso-carbon microbeads (MCMBs) were supplied from China Steel Chemical Co., Kaohsiung, Taiwan. This material has a density of about 2.24 g/cm$^3$ with a median particle size of about 16 μm. MCMB (10 grams) were intercalated with an acid solution (sulfuric acid, nitric acid, and potassium permanganate at a ratio of 4:1:0.05) for 48-96 hours. Upon completion of the reaction, the mixture was poured into deionized water and filtered. The intercalated MCMBs were repeatedly washed in a 5% solution of HCl to remove most of the sulfate ions. The sample was then washed repeatedly with deionized water until the pH of the filtrate was no less than 4.5. The slurry was then subjected ultrasonication for 10-100 minutes to produce GO suspensions. TEM and atomic force microscopic studies indicate that most of the GO sheets were single-layer graphene when the oxidation treatment exceeded 72 hours, and 2- or 3-layer graphene when the oxidation time was from 48 to 72 hours.

The GO sheets contain oxygen proportion of approximately 35%-47% by weight for oxidation treatment times of 48-96 hours. GO sheets were suspended in water. The GO suspension was cast into thin graphene oxide films on a glass surface and, separately, was also slot die-coated onto a PET film substrate, dried, and peeled off from the PET substrate to form GO films. The GO films were separately heated from room temperature to 2,500° C. and then roll-pressed to obtain reduced graphene oxide (RGO) films for use as a heat spreader. The thermal conductivity of these films were found to be from 1,225 to 1,750 W/mK using Neize heat conductivity measuring device.

Example 2: Preparation of Pristine Graphene Sheets (0% Oxygen) and Heat Spreader Films Pristine graphene sheets were produced by using the direct ultrasonication or liquid-phase production process. In a typical procedure, five grams of graphite flakes, ground to approximately 20 μm or less in sizes, were dispersed in 1,000 mL of deionized water (containing 0.1% by weight of a dispersing agent, Zonyl® FSO from DuPont) to obtain a suspension. An ultrasonic energy level of 85 W (Branson S450 Ultrasonicator) was used for exfoliation, separation, and size reduction of graphene sheets for a period of 15 minutes to 2 hours. The resulting graphene sheets are pristine graphene that have never been oxidized and are oxygen-free and relatively defect-free. There are no other non-carbon elements.

The pristine graphene sheets were immersed into a 10 mM acetone solution of BPO for 30 min and were then taken out drying naturally in air. The heat-initiated chemical reaction to functionalize graphene sheets was conducted at 80° C. in a high-pressure stainless steel container filled with pure nitrogen. Subsequently, the samples were rinsed thoroughly in acetone to remove BPO residues for subsequent Raman characterization. As the reaction time increased, the characteristic disorder-induced D band around 1330 cm$^{-1}$ emerged and gradually became the most prominent feature of the Raman spectra. The D-band is originated from the A$_{1g}$ mode breathing vibrations of six-membered sp$^2$ carbon rings, and becomes Raman active after neighboring sp$^2$ carbon atoms are converted to sp$^3$ hybridization. In addition, the double resonance 2D band around 2670 cm$^{-1}$ became significantly weakened, while the G band around 1580 cm$^{-1}$ was broadened due to the presence of a defect-induced D' shoulder peak at ~1620 cm$^{-1}$. These observations suggest that covalent C—C bonds were formed and thus a degree of structural disorder was generated by the transformation from sp$^2$ to sp$^3$ configuration due to reaction with BPO.

The functionalized graphene sheets were re-dispersed in water to produce a graphene dispersion. The dispersion was then made into graphene films using comma coating and subjected to heat treatments up to 2,500° C. The heat spreader films obtained from functionalized graphene sheets exhibit a thermal conductivity from 1,450 to 1,750 W/mK. On a separate basis, non-functionalized pristine graphene powder was directly compressed into graphene films (aggregates of graphene sheets) using pairs of steel rollers; no subsequent heat treatment was conducted. These graphene films exhibit a thermal conductivity typically from approximately 600 to about 1,000 W/mK.

Example 3: Preparation of Graphene Fluoride Sheets and Heat Spreader Films

Several processes have been used by us to produce GF, but only one process is herein described as an example. In a typical procedure, highly exfoliated graphite (HEG) was prepared from intercalated compound C$_2$F·xClF$_3$. HEG was further fluorinated by vapors of chlorine trifluoride to yield fluorinated highly exfoliated graphite (FHEG). Pre-cooled Teflon reactor was filled with 20-30 mL of liquid pre-cooled ClF$_3$, the reactor was closed and cooled to liquid nitrogen temperature. Then, no more than 1 g of HEG was put in a container with holes for ClF$_3$ gas to access and situated inside the reactor. In 7-10 days a gray-beige product with approximate formula C$_2$F was formed.

Subsequently, a small amount of FHEG (approximately 0.5 mg) was mixed with 20-30 mL of an organic solvent (methanol, ethanol, 1-propanol, 2-propanol, 1-butanol, tert-butanol, isoamyl alcohol) and subjected to an ultrasound treatment (280 W) for 30 min, leading to the formation of homogeneous yellowish dispersions. Five minutes of sonication was enough to obtain a relatively homogenous dispersion, but a longer sonication time ensured better stability. Upon extrusion to form wet films on a glass surface with the solvent removed, the dispersion became brownish films formed on the glass surface. The dried films, upon drying and roll-pressing, became heat spreader films having a reasonably good thermal conductor (thermal conductivity from 250 to 750 W/mK), yet an electrical insulator. The unique combination of electrical insulation and thermal conduction characteristics is of particular interest for battery heating configurations wherein there is no concern of any potential negative effect cause by an electrical conductor.

Example 4: Preparation of Nitrogenated Graphene Sheets and Graphene Films for Use as a Heat Spreader Element Graphene oxide (GO), synthesized in Example 1, was finely ground with different proportions of urea and the pelletized mixture heated in a microwave reactor (900 W) for 30 s. The product was washed several times with deionized water and vacuum dried. In this method graphene oxide gets simultaneously reduced and doped with nitrogen. The products obtained with graphene/urea mass ratios of 1/0.5, 1/1 and 1/2 have the nitrogen contents of 14.7, 18.2 and 17.5 wt. %, respectively, as found by elemental analysis. These nitrogenated graphene sheets, without prior chemical functionalization, remain dispersible in water. The resulting suspensions were then coated and made into wet films and then dried. The dried films were roll-pressed to obtain graphene films, having a thermal conductivity from 350 to 820 W/mK. These films are also electrical insulators.

Example 5: Lithium-Ion, Sodium-Ion, Lithium Metal, Lithium-Sulfur Batteries Cooled by Heat-Spreader-Mediated Cooling For most of the anode and cathode active materials investigated, we prepared lithium-ion cells or lithium metal cells using the conventional slurry coating method. A typical anode composition includes 85 wt. % active material (e.g., graphene-encapsulated Si, SiO, $SnO_2$, and $Co_3O_4$ particles available from Angstron Energy Co., Dayton, Ohio), 7 wt. % acetylene black (Super-P), and 8 wt. % polyvinylidene fluoride binder (PVDF, 5 wt. % solid content) dissolved in N-methyl-2-pyrrolidinoe (NMP). After coating the slurries on Cu foil, the electrodes were dried at 120° C. in vacuum for 2 h to remove the solvent. It may be noted that Cu foil recited here is used as a current collector that allows electric current to go in and out of the anode electrode. A separate sheet of Cu foil may be added as a heat spreader element for heat-transporting purpose, not for conducting electrons.

Cathode layers (e.g. LFP, NCM, $LiCoO_2$, etc.) are made in a similar manner (using Al foil as the cathode current collector) using the conventional slurry coating and drying procedures. An anode layer, separator layer (e.g. Celgard 2400 membrane), a cathode layer, and a heat spreader layer (graphene film, flexible graphite sheet, Cu foil, Ni foil, etc.) are then laminated together and housed in a plastic-Al envelop (a protective housing or casing). An anode tab or terminal, a cathode tab, and a heat spreader tab are allowed to get protruded out of the protective housing, as illustrated in FIG. 1(A).

The cell is then injected with 1 M $LiPF_6$ electrolyte solution dissolved in a mixture of ethylene carbonate (EC) and diethyl carbonate (DEC) (EC-DEC, 1:1 v/v). In some cells, ionic liquids were used as the liquid electrolyte. The cell assemblies were made in an argon-filled glove-box.

For battery performance assessment, cyclic voltammetry (CV) measurements were carried out using an Arbin electrochemical workstation at a typical scanning rate of 1-100 mV/s. In addition, the electrochemical performances of various cells were also evaluated by galvanostatic charge/discharge cycling at a current density of from 50 mA/g to 10 A/g. For long-term cycling tests, multi-channel battery testers manufactured by LAND were used. An environment-controlled oven was used to perform battery testing at different temperatures when desired.

Example 6: Some Examples of Cathode Active Materials for a Lithium Metal Battery Cathode active materials in lithium-ion or lithium metal secondary batteries are known to have a relatively low thermal conductivity. It is thus advantageous to encapsulate cathode active material particles with graphene which, if coupled with a high thermal conductivity heat spreader (e.g. graphene film or artificial graphite film from graphitized PI), enables faster heat dissipation to the ambient.

For instance, lithium iron phosphate (LFP) powder, uncoated or carbon-coated, is commercially available from several sources. The carbon-coated LFP powder and uncoated LFP powder samples were separately mixed with natural graphite particles in ball mill pots of a high-intensity ball mill apparatus. The apparatus was operated for 0.5 to 4 hours for each LFP material to produce graphene-encapsulated LFP particles.

$V_2O_5$ powder is commercially available. A mixture of $V_2O_5$ powder and natural graphite (10/1 weight ratio) was sealed in each of 4 ball milling pots symmetrically positioned in a high-intensity ball mill. The mill was operated for 1 hour to produce particulates of graphene-encapsulated $V_2O_5$ particles, which were implemented as the cathode active material in a lithium metal battery. Coated primary particles, 2-7.5% by weight pristine graphene or amine-functionalized graphene sheets, and a small amount of surfactant (Triton-100) were added into deionized water to make slurries. The slurries were then ultrasonic sprayed onto glass substrate surface to form particulates.

In a set of experiments, a mixture of $LiCoO_2$ powder and natural graphite (100/1-10/1 weight ratio) was sealed in each of 4 ball milling pots symmetrically positioned in a high-intensity ball mill. The mill was operated for 0.5-4 hours to produce particulates of graphene-encapsulated $LiCoO_2$ particles.

Example 7: Organic Cathode Active Material ($Li_2C_6O_6$) of a Fast-Cooling Lithium Metal Battery The experiments associated with this example were conducted to determine if organic materials, such as $Li_2C_6O_6$, can be encapsulated in graphene sheets using the presently invented direct transfer method. The result is that organic active materials alone are typically incapable of peeling off graphene sheets from graphite particles. However, if a second active material (i.e. rigid particles of an inorganic material or a metal oxide/phosphate/sulfide) is implemented along with an organic active material in a ball milling pot, then the organic material particles and inorganic material particles can be separately or concurrently encapsulated to form graphene-encapsulated organic particles, graphene-encapsulated inorganic particles, and graphene-encapsulated mixture of organic and inorganic particles. This is interesting and surprising.

In order to synthesize dilithium rhodizonate ($Li_2C_6O_6$), the rhodizonic acid dihydrate (species 1 in the following scheme) was used as a precursor. A basic lithium salt, $Li_2CO_3$ can be used in aqueous media to neutralize both enediolic acid functions. Strictly stoichiometric quantities of both reactants, rhodizonic acid and lithium carbonate, were allowed to react for 10 hours to achieve a yield of 90%. Dilithium rhodizonate (species 2) was readily soluble even in a small amount of water, implying that water molecules are present in species 2. Water was removed in a vacuum at 180° C. for 3 hours to obtain the anhydrous version (species 3).

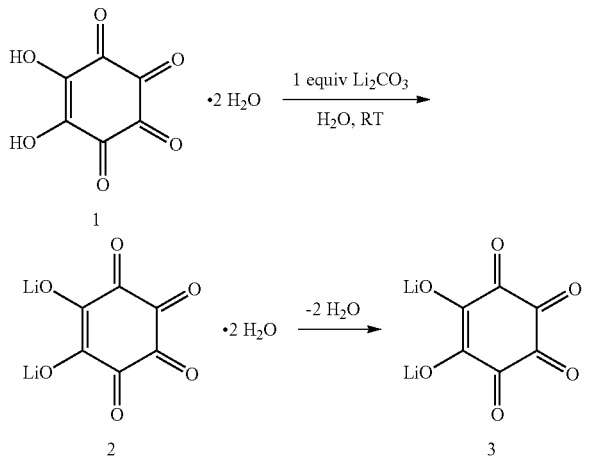

A mixture of an organic cathode active material ($Li_2C_6O_6$) and an inorganic cathode active material ($V_2O_5$ and $MoS_2$, separately) was ball-milled for 0.5-2.0 hours to obtain a mixture of graphene-encapsulated particles.

Coated primary particles, 2-7.5% by weight pristine graphene or amine-functionalized graphene sheets, and a small amount of surfactant (Triton-100) were added into deionized water to make slurries. The slurries were then ultrasonic sprayed onto glass substrate surface to form particulates. It may be noted that the two Li atoms in the formula $Li2C_6O_6$ are part of the fixed that lithium ions must come from the anode side. Hence, there must be a lithium source (e.g. lithium metal or lithium metal alloy) at the anode. In one battery cell herein tested, the anode current collector (Cu foil) is deposited with a layer of lithium (via sputtering). The resulting cell is a lithium metal cell. Flexible graphite sheets, Cu foil, and graphene fluoride films were used as a heat spreader element material to enable faster cooling.

Example 8: Graphene-Encapsulated $Na_3V_2(PO_4)_3$/C and $Na_3V_2(PO_4)_3$ Cathodes for Sodium Metal Batteries The $Na_3V_2(PO_4)_3$/C sample was synthesized by a solid state reaction according to the following procedure: a stoichiometric mixture of $NaH_2PO_4 \cdot 2H_2O$ (99.9%, Alpha) and $V_2O_3$ (99.9%, Alpha) powders was put in an agate jar as a precursor and then the precursor was ball-milled in a planetary ball mill at 400 rpm in a stainless steel vessel for 8 h. During ball milling, for the carbon coated sample, sugar (99.9%, Alpha) was also added as the carbon precursor and the reductive agent, which prevents the oxidation of $V^{3+}$. After ball milling, the mixture was heated at 900° C. for 24 h in Ar atmosphere. Separately, the $Na_3V_2(PO_4)_3$ powder was prepared in a similar manner, but without sugar. Samples of both powders were then subjected to ball milling in the presence of natural graphite particles to prepare graphene-encapsulated $Na_3V_2(PO_4)_3$ particles and graphene-encapsulated carbon-coated $Na_3V_2(PO_4)_3$ particles. Coated primary particles, 5-13.5% by weight pristine graphene or amine-functionalized graphene sheets, and a small amount of surfactant (Triton-100) were added into deionized water to make slurries. The slurries were then spray-dried to form particulates.

The particulates of cathode active materials were used in several Na metal cells containing 1 M of $NaPF_6$ salt in PC+DOL as the electrolyte. It was discovered that graphene encapsulation significantly improved the cycle stability of all Na metal cells studied. In terms of cycle life, the following sequence was observed: graphene-encapsulated $Na_3V_2(PO_4)_3$/C>graphene-encapsulated $Na_3V_2(PO_4)_3$>$Na_3V_2(PO_4)_3$/C>$Na_3V_2(PO_4)_3$. The incorporation of graphene films or PI-derived graphitic films, used as a heat spreader, enables the sodium metal cells to maintain a safe operating temperature.

Example 9: Preparation of Graphene-Encapsulated $MoS_2$ Particles as a Cathode Active Material of a Na Metal Battery (Fast Cooling Enabled by a Heat-Spreader Element)

A wide variety of inorganic materials were investigated in this example. For instance, an ultra-thin $MoS_2$ material was synthesized by a one-step solvothermal reaction of $(NH_4)_2MoS_4$ and hydrazine in N, N-dimethylformamide (DMF) at 200° C. In a typical procedure, 22 mg of $(NH_4)_2MoS_4$ was added to 10 ml of DMF. The mixture was sonicated at room temperature for approximately 10 min until a clear and homogeneous solution was obtained. After that, 0.1 ml of $N_2H_4 \cdot H_2O$ was added. The reaction solution was further sonicated for 30 min before being transferred to a 40 mL Teflon-lined autoclave. The system was heated in an oven at 200° C. for 10 h. Product was collected by centrifugation at 8000 rpm for 5 min, washed with DI water and recollected by centrifugation. The washing step was repeated for 5 times to ensure that most DMF was removed.

Subsequently, $MoS_2$ particles were dried and subjected to graphene encapsulation by high-intensity ball milling in the presence of natural graphite particles. An Al foil and a flexible graphite sheet were separately used as a heat spreader element in the Na metal battery.

Example 10: Preparation of Graphene-Encapsulated $MnO_2$ and $NaMnO_2$ Cathode Active Material for Fast-Chargeable Na Metal Cells and Zn Metal Cells Featuring a Heat Spreader Element For the preparation of the $MnO_2$ powder, a 0.1 mol/L $KMnO_4$ aqueous solution was prepared by dissolving potassium permanganate in deionized water. Meanwhile, 13.32 g surfactant of high purity sodium bis(2-ethylhexyl) sulfosuccinate was added in 300 mL iso-octane (oil) and stirred well to get an optically transparent solution. Then, 32.4 mL of 0.1 mol/L $KMnO_4$ solution was added into the solution, which was ultrasonicated for 30 min to prepare a dark brown precipitate. The product was separated, washed several times with distilled water and ethanol, and dried at 80° C. for 12 h. Some amount of the $MnO_2$ powder was then subjected to the direct transfer treatment to obtain graphene-encapsulated $MnO_2$ particles.

Additionally, $NaMnO_2$ particles were synthesized by ball-milling a mixture of $Na_2CO_3$ and $MnO_2$ (at a molar ratio of 1:2) for 12 h followed by heating at 870° C. for 10 h. The resulting $NaMnO_2$ particles were then subjected to ball-milling in the presence of MCMB particles to prepare graphene encapsulated $NaMnO_2$ particles.

The $MnO_2$ particles, with or without graphene encapsulation, are also incorporated in alkaline $Zn/MnO_2$ cells. Graphene encapsulation was found to dramatically increase the cycle life of this type of cell. The Zn-graphene/$MnO_2$ battery is composed of a graphene/$MnO_2$-based cathode (with an optional cathode current collector and an optional conductive filler), a Zn metal or alloy-based anode (with an optional anode current collector), and an aqueous electrolyte (e.g. a mixture of a mild $ZnSO_4$ or $Zn(NO_3)_2$ with $MnSO_4$ in water). Graphene films (RGO) were used as a heat spreader element in the battery cell to enable fast cooling.

The invention claimed is:

1. A rechargeable battery system comprising at least a battery cell and an external cooling means, wherein the battery cell comprises an anode, a cathode, an electrolyte disposed between the anode and the cathode, a protective housing that at least partially encloses the anode, the cathode and the electrolyte, and a heat-spreader element disposed partially inside the protective housing and wherein the external cooling means is in thermal contact with the heat spreader element configured to enable transporting internal heat of the battery cell through the heat spreader element to the external cooling means;
  wherein said heat-spreader element comprises a material selected from graphene film sheet, artificial graphite film, brass, Ti, Ni, Mg alloy sheet, boron arsenide, a composite thereof, or a combination thereof;
  wherein the heat-spreader element has a thickness from 0.5 μm to 1 mm, and
  wherein the heat-spreader element has a tab protruded outside of the protective housing,
  wherein the tab is configured to controllably make thermal contact with the external cooling means and get disconnected with the external cooling means when a battery temperature reaches temperature Tc.

2. The rechargeable battery system of claim 1, wherein the external cooling means is selected from a heat sink, a heat pipe, a vapor chamber, a stream of flowing fluid, a thermoelectric device, a heat exchanger, a radiator, or a combination; and wherein the heat-spreader element has a heat-spreading area at least as large as 50% of a surface area of the anode or cathode.

3. The rechargeable battery system of claim 1, further comprising at least a temperature sensor for measuring an internal temperature of the battery cell.

4. The rechargeable battery system of claim 1, wherein the heat-spreader element acts as a temperature sensor for measuring an internal temperature of the battery cell.

5. The rechargeable battery system of claim 1, wherein said heat-spreader element comprises a high thermal conductivity material having a thermal conductivity no less than 10 W/mK.

6. The rechargeable battery system of claim 1 wherein said graphene film sheet contains a graphene selected from pristine graphene, graphene oxide, reduced graphene oxide, graphene fluoride, graphene chloride, graphene bromide, graphene iodide, hydrogenated graphene, nitrogenated graphene, chemically functionalized graphene, or a combination thereof.

7. The rechargeable battery system of claim 1, wherein the heat-spreader element has a heat-spreading area at least 50% of a surface area of the anode or cathode.

8. The rechargeable battery system of claim 1, wherein the heat-spreader element is flat and has a large heat-spreading area having a length-to-thickness ratio greater than 10.

9. The rechargeable battery system of claim 1, wherein the heat-spreader element is in a heat-spreading relation to the anode or the cathode and provides heat thereto before or during charging of the battery cell.

10. The rechargeable battery system of claim 1, wherein the battery cell has an anode terminal and a cathode terminal for operating the battery cell and the heat-spreader element is in thermal contact with the anode terminal or the cathode terminal;
  wherein the anode terminal or the cathode terminal is configured to receive heat from an outside cooling means.

11. The rechargeable battery system of claim 1, wherein the heat-spreader element is in thermal contact with the protective housing or a cap of the protective housing.

12. The rechargeable battery system of claim 1, wherein the battery cell is a lithium-ion battery, lithium metal secondary battery, lithium-sulfur battery, lithium-air battery, lithium-selenium battery, sodium-ion battery, sodium metal secondary battery, sodium-sulfur battery, sodium-air battery, magnesium-ion battery, magnesium metal battery, aluminum-ion battery, aluminum metal secondary battery, zinc-ion battery, zinc metal battery, zinc-air battery, nickel metal hydride battery, lead acid battery, lead acid-carbon battery, lead acid-based ultra-battery, lithium-ion capacitor, or supercapacitor.

\* \* \* \* \*